(12) United States Patent
Peterson et al.

(10) Patent No.: US 7,335,319 B2
(45) Date of Patent: Feb. 26, 2008

(54) SEMICONDUCTOR STRESS BUFFER COATING EDGE BEAD REMOVAL COMPOSITIONS AND METHOD FOR THEIR USE

(75) Inventors: Laurie J. Peterson, Phoenix, AZ (US); Richard L. Hopla, Cranston, RI (US); Ahmad A. Naiini, East Greenwich, RI (US); William D. Weber, Rumford, RI (US); Pamela J. Waterson, Northbridge, MA (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/359,327

(22) Filed: Feb. 6, 2003

(65) Prior Publication Data

US 2003/0227005 A1 Dec. 11, 2003

Related U.S. Application Data (60) Provisional application No. 60/355,617, filed on Feb. 6, 2002.

(51) Int. Cl.
*B01F 1/00* (2006.01)
*H01L 21/31* (2006.01)
*H01L 21/465* (2006.01)

(52) U.S. Cl. ...................... 252/364; 438/759
(58) Field of Classification Search ................ 252/364; 438/759
See application file for complete search history.

(56) References Cited

U.S. PATENT DOCUMENTS 2,438,038 A 3/1948 Craver .................. 252/170

(Continued)

FOREIGN PATENT DOCUMENTS

CH 670832 A5 7/1989

(Continued)

OTHER PUBLICATIONS

International Search Report Application No. PCT/US03/03584 dated Dec. 31, 2003.

(Continued)

*Primary Examiner*—Daniel S. Metzmaier
(74) *Attorney, Agent, or Firm*—Ohlandt, Greeley, Ruggiero & Perle, LLP (57) ABSTRACT

An edge bead remover composition that includes at least one ketone selected from the group consisting of:

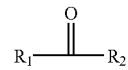

Formula 1

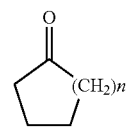

Formula 2 wherein $R_1$ and $R_2$ are independently selected from the group consisting of:
methyl, ethyl, n-propyl, n-butyl, sec-butyl, and isobutyl, and wherein n equals 1 or 2;
at least one ester other than lactones; and
at least one lactone.

1 Claim, 2 Drawing Sheets

U.S. PATENT DOCUMENTS

| | | | |
|---|---|---|---|
| 3,615,825 A | 10/1971 | Gansser | 134/38 |
| 3,681,250 A | 8/1972 | Murphy | 252/158 |
| 3,954,648 A | 5/1976 | Belcak et al. | 252/158 |
| 3,972,839 A | 8/1976 | Murphy | 252/548 |
| 4,120,810 A | 10/1978 | Palmer | 252/153 |
| 4,508,634 A | 4/1985 | Elepano et al. | 252/163 |
| 4,518,678 A | 5/1985 | Allen | 430/311 |
| 4,548,891 A | 10/1985 | Reidiker et al. | 430/283 |
| 4,767,564 A | 8/1988 | Kitchens et al. | 252/187.26 |
| 4,780,235 A | 10/1988 | Jackson | 252/170 |
| 4,812,255 A | 3/1989 | Suwala | 252/142 |
| 4,836,950 A | 6/1989 | Madsen et al. | 252/153 |
| 4,886,728 A | 12/1989 | Salamy et al. | 430/331 |
| 4,927,556 A | 5/1990 | Pokorny | 252/173 |
| 5,006,279 A | 4/1991 | Grobbel et al. | 252/542 |
| 5,011,621 A | 4/1991 | Sullivan | 252/162 |
| 5,011,755 A | 4/1991 | Rohde et al. | 430/18 |
| 5,015,410 A | 5/1991 | Sullivan | 252/166 |
| 5,019,482 A | 5/1991 | Ai et al. | 430/283 |
| 5,030,290 A | 7/1991 | Davis | 134/4 |
| 5,035,829 A | 7/1991 | Suwala | 252/170 |
| 5,049,300 A | 9/1991 | Fusiak et al. | 252/162 |
| 5,098,592 A | 3/1992 | Narayanan et al. | 252/162 |
| 5,106,525 A | 4/1992 | Sullivan | 252/162 |
| 5,215,675 A | 6/1993 | Wilkins et al. | 252/100 |
| 5,362,608 A | 11/1994 | Flaim et al. | 430/327 |
| 5,413,729 A | 5/1995 | Gaul | 252/162 |
| 5,426,017 A | 6/1995 | Johnson | 430/331 |
| 5,449,584 A | 9/1995 | Banba et al. | 430/190 |
| 5,779,928 A | 7/1998 | Yamashita et al. | |
| 5,814,433 A | 9/1998 | Neslon et al. | 430/326 |
| 5,849,457 A | 12/1998 | Namba et al. | 430/191 |
| 5,866,305 A | 2/1999 | Chon et al. | 430/331 |
| 5,876,895 A * | 3/1999 | Hishiro et al. | 430/191 |
| 5,981,145 A | 11/1999 | Ding et al. | 430/27.1 |
| 6,015,467 A | 1/2000 | Nagasawa et al. | 134/1 |
| 6,114,085 A | 9/2000 | Padmanaban et al. | 430/270.1 |
| 6,117,623 A | 9/2000 | Koshiyama et al. | 430/331 |
| 6,127,086 A | 10/2000 | Waterson et al. | 430/190 |
| 6,159,646 A | 12/2000 | Jeon et al. | 430/30 |
| 6,432,622 B1 | 8/2002 | Moon et al. | 430/331 |
| 6,458,518 B1 | 10/2002 | Moon et al. | 430/329 |
| 6,617,225 B2 | 9/2003 | Boyle et al. | 438/455 |

FOREIGN PATENT DOCUMENTS

| | | |
|---|---|---|
| EP | 0 327 290 A1 | 1/1989 |
| EP | 1 110 719 | 6/2001 |
| GB | 2172304 A | 9/1986 |
| GB | 2191501 A | 12/1987 |
| GB | 2 357 343 A | 6/2001 |
| JP | 06-212193 | 6/1994 |
| JP | 06-212193 | 8/1994 |
| JP | 07-160008 | 6/1995 |
| JP | 08-232182 | 9/1996 |
| JP | 10-036891 | 2/1998 |
| JP | 10-097079 | 4/1998 |
| JP | 11-218933 | 8/1999 |
| JP | 2000-31969 | 1/2000 |
| JP | 2000-319691 | 11/2000 |
| WO | WO 87/07628 | 12/1987 |

OTHER PUBLICATIONS

Robock et at. "*Microelectronics Packaging Handbook*", Van Nostrand Reinhold, New York, 1989, p. 540, month unknown.

Hopla et al. "*An Advanced Photosensitive Polyamic Ester for Improved Reliability and Multiple Wavelength Lithography*", Presented at the 1994 Ellenville Conference, month unknown.

Hinsberg et al., "*Influence of Polymer Properties On Airborne Chemical Contamination of Chemically Amplified Resists*", SPIE vol. 1925, pp. 43-52, 1993, month unknown.

Makabe, et al., "*A Novel Positive Working Photosensitive Polymer For Semiconductor Surface Coating*", Journal of Photopolymer Science and Technology, vol. 10 No. 2 1997, pp. 307-312, month unknown.

Supplementary European Search Report Nov. 7, 2007 for corresponding European Patent Application No. 03 71 5984 (Nov. 2007).

\* cited by examiner

Figure 1

(PRIOR ART)

Figure 2

(PRIOR ART)

Figure 3

(PRIOR ART)

SEMICONDUCTOR STRESS BUFFER COATING EDGE BEAD REMOVAL COMPOSITIONS AND METHOD FOR THEIR USE

RELATED APPLICATION

This application claims priority from Provisional Patent Application Ser. No. 60/355,617, filed on Feb. 6, 2002.

BACKGROUND OF THE INVENTION

1. Field of the Invention

The invention relates to semiconductor device fabrication on silicon wafers or other substrates and, more particularly, to solvent compositions and methods for their use in removing excess amounts of stress buffer coating materials from the coated or top side periphery of the wafer, from the wafer edge, and from the non-coated or bottom side of the wafer.

2. Description of the Prior Art

Stress buffer coating materials such as polyimide and polybenzoxazole films have proven useful for improving the reliability of packaged semiconductor devices (P. V. Robock and L. T. Nguyen, in R. Tummala and E. J. Rymaszewski, ed., *Microelectronics Packaging Handbook,* Van Nostrand Reinhold, New York, 540, (1989)). Stress buffer coatings are formed on semiconductor devices in layers 2-25 microns thick using standard semiconductor industry methods using the consecutive process steps of spin coating a stress buffer coating composition such as those based on polyirmide (K. Horie and T. Yamashita, ed., *Photosensitive Polyimides: Fundamentals and Applications,* Technomic Publishing Co., Inc., Lancaster, Pa., (1995) and R. Hopla, P. Falcigno, S. Hagen, J. Herbert, D. Huglin, H. J. Kirner, T. Maw, A. Schaffner, W. Weber, and O. Rhode, *Proceedings of The 10th International SPE Conference on Photopolymers,* Mid-Hudson SPE, 1994, pp. 463-469) or polybenzoxazole ("A Novel Positive Working Photosensitive Polymer For Semiconductor Surface Coating", H. Makabe, T. Banba, and T. Hirano, Journal of Photopolymer Science and Technology, Volume 10, Number 2(1997) pp. 307-312) precursor polymers, edge bead removal, soft baking the wet coating to yield a rigid film that does not flow at room temperature, forming relief structures in the film using a lithographic process, followed by final curing in an oven or furnace at a temperature and time sufficient to convert the precursor into a polyimide or polybenzoxazole stress buffer film. In the case of photosensitive stress buffer compositions, the relief structures may be formed by direct lithographic exposure. In the case of non-photosensitive stress buffer compositions, an indirect lithographic process using image transfer through a sacrificial photoresist film which is applied to the stress buffer coating precursor film in a separate and subsequent coating step may be used. For either the direct or indirect lithographic process, an image is formed in the photosensitive film by exposing the film to actinic radiation that has first been passed through a patterning mask. Actinic radiation in the wavelength range of 240 to 500 nm can be used and the emission lines at 365, 405, and 436 nm of the mercury lamp are particularly useful for this purpose.

When spin coated, stress buffer coating formulations leave a band or "edge bead" of material at the wafer periphery that is significantly thicker than the coating on the rest of the wafer area. This region of significantly greater coating thickness varies from 1-3 millimeters in width and is found around the complete circumference of the wafer. The thickness of this edge bead can be twice that of the remainder of the coated area. Additionally, coating material is deposited on the edge of the wafer and very frequently flows over the wafer edge and deposits on the non-coated or bottom side of the wafer thereby contaminating the bottom and edge of the wafer.

The presence of the edge bead causes difficulties in maintaining optimal optical focus when step and repeat exposure tools, i.e., steppers, are used to image the photosensitive coatings resulting in a loss in pattern resolution. Specifically, an image that is in focus in the interior region of the wafer where no edge bead is present is out of focus in the edge bead containing region resulting in poor pattern definition and a consequent loss in manufacturing yield. Because the thick edge bead has a greater optical absorbance than the remainder of the film, larger exposure doses are required to form a latent image in the edge bead. Attempts to image the edge bead result in an overexposure condition in the remainder of the film resulting in poor pattern definition. Excess material on the wafer edge is prone to chipping and thus produces particulate contamination that can adversely affect the yield of processes. Excess material on the bottom side of wafers can result in contamination of semiconductor device manufacturing equipment. Step and repeat exposure tools are especially affected because the bottom side contamination prevents the wafer from being positioned orthogonally to the mask image. If the contamination is transferred to the stepper wafer stage, the focus of subsequent wafers may be compromised. This transferred contamination leads to an out-of-focus condition on some regions of the wafers that are subsequently processed in the exposure equipment. Additionally, the desired functions of the wafer handling devices on the coating equipment and on the hot plates that are used to bake the coated substrate may be adversely affected by the presence of contamination on the wafer edge and bottom side. Accordingly, it is very important to mitigate the adverse effects of the stress buffer coating material edge bead and the edge and bottom side contamination prior to the exposure step by using an edge bead remover (EBR) solvent to reduce the thickness of the edge bead and to remove the edge and bottom side contamination.

Figure 1:
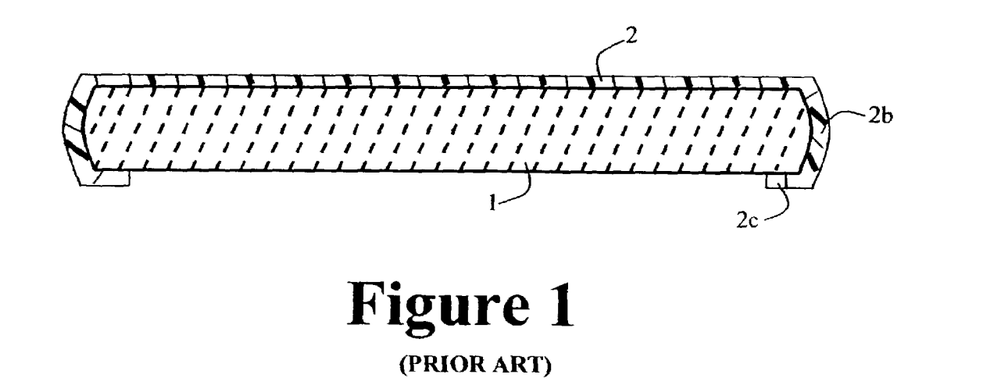
FIG. 1 is the prior art reproduced FIG. 2 of U.S. Pat. No. 4,518,678 as a cross sectional diagram showing a photoresist coating based on a composition containing a novolac resin and an ortho-quinonediazide on a wafer substrate prior to the application of an edge bead removal solvent.
Figure 2:
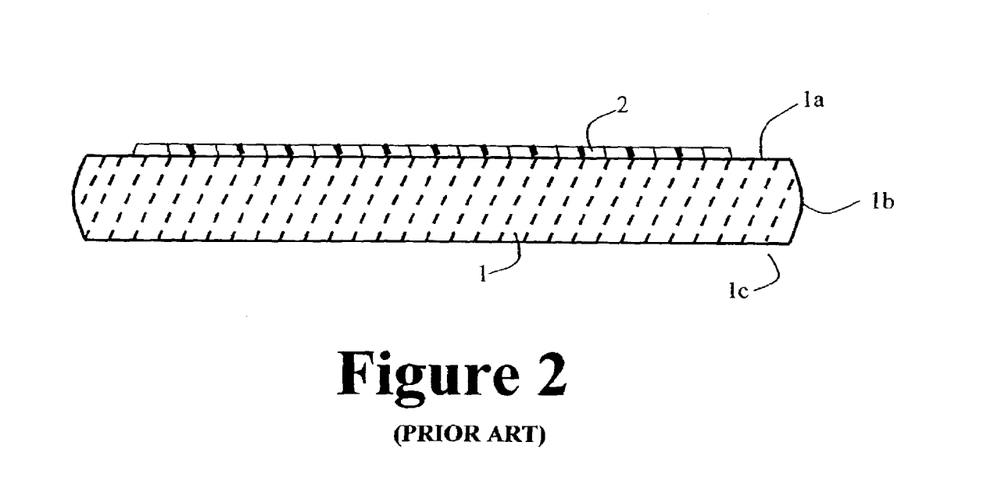
FIG. 2 is the prior art reproduced FIG. 3 of U.S. Pat. No. 4,518,678 and illustrates the result of performing an edge bead removal process on the photoresist coating of FIG. 1.

Edge bead removal solvents have been developed for removing the edge bead and bottom side contamination resulting from spin coated photoresist compositions that are primarily composed of novolac resin binders and photoactive compounds that are ortho-quinonediazide derivatives. FIG. 2 of U.S. Pat. No. 4,518,678 provides a cross sectional diagram, reproduced herein as FIG. 1, showing a photoresist coating based on a composition containing a novolac resin and an ortho-quinonediazide on a wafer substrate prior to the application of an edge bead removal solvent. The essential features of FIG. 1 are the substrate 1 and the coating 2 wherein 2b represents the coating that extends around the edge of the substrate and 2c represents the coating that extends onto the edge of the substrate bottom surface. FIG. 3 of U.S. Pat. No. 4,518,678, reproduced herein as FIG. 2, illustrates the result of performing an edge bead removal process on the photoresist coating of FIG. 1. The essential features of FIG. 2 are the peripheral band of exposed substrate 1a on the upper surface of the substrate 1, the exposed substrate edge 1b, and the peripheral bottom edge of the substrate 1c from which bottom side resist contamination has been removed.

Several solvents and solvent mixtures have been described and employed as edge bead removers for photoresists. For example, U.S. Pat. No. 4,886,728 teaches the application of a mixture of ethyl lactate and methyl ethyl ketone as an EBR solvent for removal of photoresist from the edge or bottom side of wafers. U.S. Pat. No. 5,426,017 describes the use of mixtures containing $C_4$ to $C_8$ alkyl acetates, $C_4$ to $C_8$ alkyl alcohols, and water as EBR compositions for use with photoresists based on novolac resin binders and ortho-quinonediazide photoactive compounds. U.S. Pat. No. 5,814,433 teaches the use of a mixture of ethyl lactate and N-methylpyrollidone (NMP) as an EBR composition for removal of photoresist. Since it has been established that NMP has detrimental effects on the performance of chemically amplified 248 and 193 nm photoresists (U.S. Pat. No. 6,277,546 B1; "Influence of Polymer Properties On Airborne Chemical Contamination of Chemically Amplified Resists", W. D, Hinsberg, S. A. MacDonald, N. J. Clecak, C. D. Snyder, and H. Ito, SPIE vol. 1925, pp. 43-52, 1993), use of NMP-containing compositions is prohibited in many semiconductor fabrication facilities where such chemically amplified resists are used. U.S. Pat. No. 5,362,608 describes the use of tetrahydrofurfuryl alcohol as the active component of NMP-free EBR compositions stated to be compatible with 248 nm photoresist. U.S. Pat. No. 5,866,305 describes the application of an EBR and bottom side cleaner composition that includes at least ethyl lactate and ethyl 3-ethoxypropionate, and preferentially includes less than 10% gamma-butyrolactone. U.S. Pat. No. 6,015,467 describes an edge bead removing process using a solvent composition that includes one of dipropylene glycol monoalkyl ether alone, a mixture of this ether and an easily volatile organic solvent, and a mixture of the ether, a volatile organic solvent, and an alkaline aqueous solution. U.S. Pat. No. 6,117,623 describes an EBR composition containing a lactone compound together with a second solvent selected from the group consisting of an alkoxybenzene or an aromatic alcohol with the preferred embodiment stated to be mixtures of gamma-butyrolactone and anisole. U.S. Pat. No. 6,159,646 teaches the use of compositions containing ethyl lactate, ethyl 3-ethoxypropionate and gamma-butyrolactone or a mixture of ethyl lactate and ethyl 3-ethoxypropionate or a mixture of ethyl lactate and gamma-butyrolactone as preferred compositions for use in a method for reworking photoresist coated wafers by dissolving the photoresist coating from the entire area of the wafer. JP 10-097079 teaches the use of an edge bead remover for photoresists comprising 60-90% ethyl lactate and 10-40% gamma-butyrolactone. JP 06-212193 claims solvent compositions containing an alkyl lactate which could be methyl, ethyl, isopropyl, or butyl lactates and further containing at least one of NMP, DMF, DMAc, methyl acetate, ethyl acetate, GBL, DMSO, or sulfolane with the composition being directed to removing residue remaining after resist stripping. GB 2357343 claims a photoresist stripper composition comprising a mixture of acetone, GBL, and an ester solvent and a method for use.

JP 2936897 claims an EBR solvent composition for use with polyimide precursors containing 70-85% N,N,-dimethylformamide and 15-30% methanol. JP 2000-31969 claims a solvent composition containing 60-100% of gamma-butyrolactone and preferably 1-40% of a solvent with a boiling point range lower than gamma-butyrolactone directed to edge bead removal of heat resistant polymer having imide rings or other ring structures. The cited examples of heat resistant polymers include polyimide, polyamideimide, polybenzoxazole, polybenzthiazole, and polybenzimidazole, and the polymer may be a copolymer or a blend.

Of importance and consequence is the fact that the edge bead removal process requirements for stress buffer coatings are different from the edge bead process requirements for processing standard photoresists, as described above in the prior art, in several important ways. First, the solubility of the components of stress buffer coating compositions is different than the solubility of the components of photoresists. This solubility difference is particularly true relative to the polymer components of stress buffer coating compositions compared to the polymer components of photoresists. The polymers used in photoresist compositions include cresol-formaldehyde novolacs, derivatized polyhydroxystyrenes, and derivatized polyacrylate copolymers while stress buffer coating compositions are based on polyarylamide derivatives and polyarylamide-esters. Solvents used in photoresist compositions are typically esters and include ethyl lactate, propylene glycol monomethyl ether acetate, and other solvents and solvent mixtures with a boiling point range of 120-170° C.

In general, photoresist solvents alone are not good solvents for stress buffer coating compositions. Solvents used in stress buffer coating compositions are typically polar, aprotic solvents with a boiling point range of 190-230° C. and are exemplified by N-methylpyrollidone (NMP, boiling point 202° C.) and gamma-butyrolactone (GBL, boiling point 204-205° C.). Because EBR solvents formulated for use in photoresist EBR processes are based on photoresist solvents, it is not surprising that difficulties occur when stress buffer coating EBR processes are attempted using photoresist EBR compositions.

Second, stress buffer coating processing involves forming coatings that range in thickness from 4-50 microns after soft baking while photoresists are commonly processed in a film thickness range of 0.5 to 3 microns after baking. Consequently, the material mass of the stress buffer coating edge bead is substantially greater than the material mass of a photoresist edge bead.

Third, the rheology of the spin coated films is very different. Photoresists form firm, non-flowing films during the spin coating process through solvent evaporation while stress buffer coating compositions form wet or soft, gel-like coatings that can flow after spin coating. This rheological difference between photoresist and stress buffer coatings is due to both the film thickness difference and to the difference in the volatility of the casting solvents. Since EBR processing follows the spin coating process, the wet stress buffer coatings continue to move during any of the substrate spinning operations that occur during the edge bead removal process and this movement complicates the EBR process. Indeed, after EBR solvent application has been completed, a shorter, lower spin speed process cycle is frequently necessary to reduce the tendency of the dissolved stress buffer coating material to move over the wafer edge and onto the bottom side of the wafer.

Figure 3:
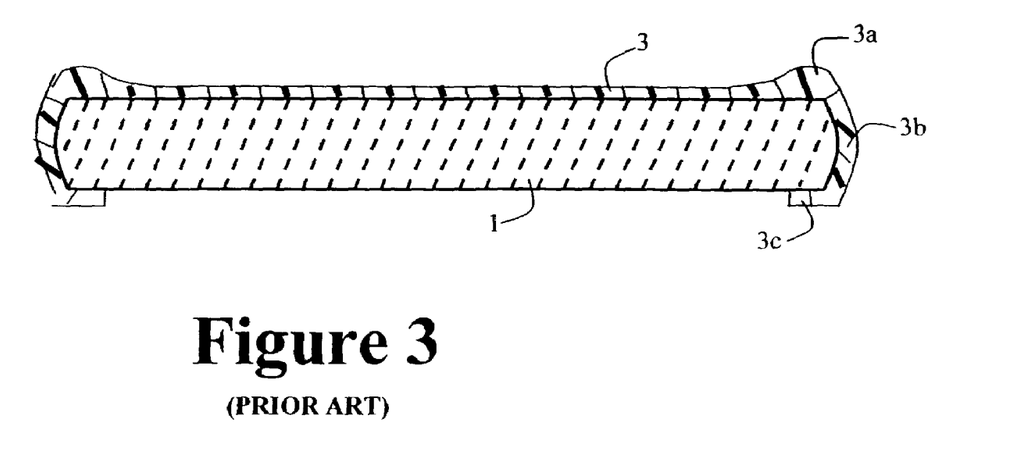
FIG. 3 is a cross-sectional side view of a wafer that has been spin coated with stress buffer coating composition and softbaked.

EBR processing of stress buffer coatings present unique problems compared to EBR processing of photoresists. In the case of photoresists, the front edge bead can be removed leaving a clear clean outer edge of exposed wafer about 1-3 mm wide as illustrated in FIG. 2. Because the wet stress buffer coating flows during wafer spinning, the front side edge bead of stress buffer coating cannot be completely removed during the edge bead removal process. FIG. 3 is a cross-sectional side view of a wafer that has been spin coated with stress buffer coating composition and softbaked. The essential features of FIG. 3 are the wafer 1 and the stress buffer coating 3 wherein 3a represents the thick edge bead characteristic of stress buffer coatings, 3b represents the coating that extends around the edge of the substrate, and 3c represents the coating that extends onto the edge of the substrate bottom surface. The goal of EBR processing on stress buffer coating films is to minimize the negative impact of the edge bead on wafer processing and yield by reducing the thickness of the edge bead region (3a) to a thickness as nearly equal to the thickness of the rest of the film as possible while removing contamination from the bottom surface of the substrate.

If an edge bead solvent containing dissolved stress buffer coating material remains on the wafer for an extended period of time, it can flow or back-stream to the bottom side of the wafer resulting in contamination of the bottom surface as illustrated in 3c of FIG. 3. Use of a volatile EBR composition provides a solvent mixture that dries more quickly and thus prevents back streaming of the dissolved material and minimizes contamination of areas that were cleaned during the edge bead removal process. However, fast drying is not the only requirement. The solvent or solvent mixture must be strong enough to reduce the thickness of the edge bead and remove any small spots of coating material that has dried on the backside side of the wafer. These small spots of material on the backside of the wafer are formed by spattering of coating material during spin coating. These small spots of material are not as soluble as the top side wet film due to convective drying during wafer spinning.

Another important reason for having good solvency is the fact that the spin coating and edge bead removal processes are performed in the same coating cup. The use of solvents or solvent mixtures that are poor solvents can lead to a build-up of residues in the coating equipment spinning cup. These residues can add another source of contamination as the residue can be deposited onto the wafer by splashing off the walls of the coater cup. Additionally, the residue in the coating cup can act to prevent or impede waste spun off the wafer and into the coater cup from flowing into waste containers.

In summary, it is important that a stress buffer coating EBR composition and process meet the combined requirements of: (1) reducing the thickness of the coating edge bead, (2) having drying characteristics such that dissolved material is not deposited onto the bottom of the wafer, (3) removing partially dried coating material from the bottom side of the wafer, and (4) not having a tendency to promote the accumulation of coating waste in the coating cup.

Therefore, the present invention addresses the need to improve the edge bead removal process for stress buffer coatings due to the inadequate performance of photoresist EBR solvents by providing a novel EBR composition that meets the above-requirements.

SUMMARY OF THE INVENTION

The present invention accordingly has an object to provide an edge bead remover (EBR) composition for use with stress buffer coating materials that has performance superior to compositions known in the art. The composition for removing an edge bead from a substrate includes at least one ketone selected from the group consisting of:

Formula 1

Formula 2 wherein $R_1$ and $R_2$ are independently selected from the group consisting of:
methyl, ethyl, n-propyl, n-butyl, sec-butyl, and isobutyl, and wherein n equals 1 or 2;
at least one ester other than lactones; and
at least one lactone.

In a broad aspect of the present invention, the at least one ketone is present in an amount between about 25 wt. % to about 55 wt. %; the at least one ester is present in an amount between about 20 wt. % to about 55 wt. %; and the at least one lactone is present in an amount between about 10 wt. % to about 35 wt. %.

The present invention also provides a composition for removing an edge bead from a substrate comprising: between about 25 wt. % to about 55 wt. % 2-pentanone; between about 20 wt. % to about 55 wt. % ethyl lactate; and between about 10 wt. % to about 35 wt. % gamma-butyrolactone.

The present invention also provides a composition for removing an edge bead from a substrate comprising: between about 30 wt. % to about 50 wt. % 2-pentanone; between about 30 wt. % to about 50 wt. % ethyl lactate; and between about 15 wt. % to about 35 wt. % gamma-butyrolactone.

The present invention further provides a composition for removing an edge bead from a substrate comprising: between about 35 wt. % to about 50 wt. % 2-pentanone; between about 35 wt. % to about 50 wt. % ethyl lactate; and between about 20 wt. % to about 30 wt. % gamma-butyrolactone.

A process for removing residue from a substrate is provided by the present invention. The process includes applying a coating composition onto the substrate to form a coated substrate with an edge bead formed thereon; contacting the edge bead formed on the coated substrate with an edge bead remover composition comprising:
at least one ketone selected from the group consisting of:

Formula 1

Formula 2 wherein $R_1$ and $R_2$ are independently selected from the group consisting of:
methyl, ethyl, n-propyl, n-butyl, sec-butyl, and isobutyl, and wherein n equals 1 or 2;
at least one ester other than lactones; and
at least one lactone, thereby dissolving the edge bead; and removing the dissolved edge bead from the coated substrate.

The present invention also provides a process for removing an edge bead from a substrate. This process includes contacting the edge bead coating with a composition comprising:

at least one ketone selected from the group consisting of:

Formula 1

Formula 2 wherein $R_1$ and $R_2$ are independently selected from the group consisting of:

methyl, ethyl, n-propyl, n-butyl, sec-butyl, and isobutyl, and wherein n equals 1 or 2;

at least one ester other than lactones; and at least one lactone, thereby dissolving the edge bead; and removing the dissolved edge bead from the substrate.

The substrate typically is coated with either a stress buffer coating or a positive photoresist coating.

DETAILED DESCRIPTION OF THE INVENTION

The present invention provides an edge bead remover (EBR) composition for use with stress buffer coating materials that has performance superior to compositions known in the art, as demonstrated herein. The present invention also provides a process for removing unwanted coating composition from the peripheral areas of a substrate coated with a stress buffer coating composition using the above mentioned compositions.

The process includes the steps of (a) spin coating a substrate with a stress buffer coating composition, (b) contacting the peripheral areas of the coated substrate with a sufficient amount of the EBR composition of the present invention, and (c) separating the dissolved coating composition from the coated substrate.

Substrates suitable for use in this invention include, but are not limited to, silicon, aluminum, copper, chromium, nickel, gold, tantalum, titanium, tungsten, ferrous metals, aluminum/copper alloys, polymeric resins, silicon dioxide, doped silicon dioxide, silicone resins, silicon carbide, silicon nitride, titanium nitride, tantalum nitride, silicon arsenide, gallium arsenide, indium phosphide, indium selenide, indium-tin oxide, tantalum, polysilicon, inorganic glasses, and ceramics that have been spin coated with a stress buffer coating composition. The preferred substrates are thermally grown silicon oxide/silicon wafers such as those employed in the production of microprocessors, memories, and other miniaturized integrated circuit components. The most preferred substrates are silicon wafers on which all of the processes necessary to fabricate functional semiconductor devices have been completed.

The stress buffer coating composition that is applied by spin coating on a silicon wafer or other substrate as a coating may be based on polyimide or polybenzoxazole precursor polymers, but is not limited to these compositions. The preferred stress buffer coating composition is based on positive-tone, photosensitive materials comprised of an aqueous base soluble polyamide resin mixed with an ortho-quinonediazide photosensitizer and dissolved in a polar, aprotic solvent such as N-methylpyrollidone or gamma-butyrolactone (U.S. Pat. No. 5,449,584, which is hereby incorporated by reference thereto). Alternatively, the positive tone photosensitive composition may contain polyamides bearing ortho-quinonediazide substituents optionally mixed with an ortho-quinonediazide photosensitizer and dissolved in a polar, aprotic solvent such as N-methylpyrollidone or gamma-butyrolactone (U.S. Pat. Nos. 6,127,086 and 6,617,225, which are hereby incorporated by reference thereto). Negative tone photosensitive compositions comprised of polyamide acid esters bearing a radiation crosslinkable group in the ester group, a radical-generating photoinitiator compound, and a suitable solvent such as N-methylpyrollidone or gamma-butyrolactone may also be used (U.S. Pat. Nos. 4,548,891; 5,011,755; and 5,019,482, which are hereby incorporated by reference thereto).

Spin coating is the preferred process for applying the stress buffer coating composition. During the spin coating operation, the silicon wafer or other substrate is placed on a vacuum chuck and spun at a high speed (e.g. 500-3,000 rpm) after or while a stress buffer composition is centrally dispersed onto the top surface of the wafer. The spin coating process parameters such as spin speed, spin time, and the like may be varied according to desired use. As previously demonstrated by FIG. 3, when spin coated, stress buffer coating formulations leave a band or "edge bead" of coating material at the wafer edge that is significantly thicker than the coating on the rest of the wafer area. The edge bead varies from about 1 to about 3 millimeters in width and is found around the complete circumference of the wafer. The thickness of the edge bead can be up to twice that of the remainder of the coated area after baking.

The preferred method of contacting the edge bead with the EBR solvent is with a spin coater equipped with both a front side and a separate bottom side EBR solvent dispense nozzle. The bottom side nozzle is a stationary nozzle that applies the solvent to the bottom side of the wafer. During EBR solvent application, the wafer spins and the solvent moves to the outer edge of the wafer and is spun off together with the dissolved coating material. The top side nozzle can be stationary or it may be equipped with a programmable movement mechanism. A stationary nozzle applies a stream of EBR solvent to a single position typically set about 1 mm to about 3 mm inward from the edge of the wafer. A nozzle with programmable movement has the ability to apply solvent in a sweeping action that ranges from the edge of the wafer to a point approximately 2 mm inside the edge of the wafer. The edge bead removal and bottom side cleaning processes can be done either simultaneously or consecutively. The most preferred method is to apply the EBR solvent using simultaneous top and bottom side application. The edge bead removal process is completed using a spin dry cycle which consists of spinning the wafer for a time necessary to spin off excess EBR solvent and EBR solvent containing dissolved stress buffer coating composition and to dry the wafer.

Figure 4:
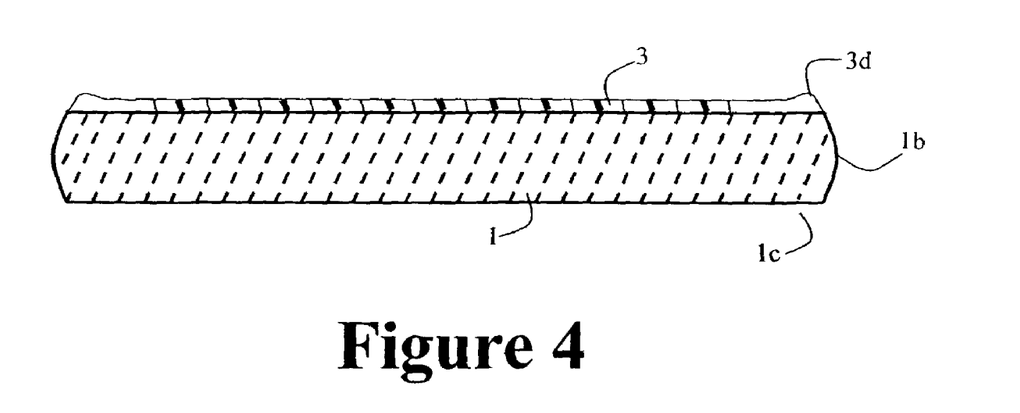
FIG. 4 illustrates the result of spin coating a wafer with a stress buffer coating composition, performing an EBR process, and then soft baking the coated wafer.

FIG. 4 illustrates the result of spin coating a wafer with a stress buffer coating composition, performing an EBR process, and then soft baking the coated wafer. FIG. 4 is a cross-sectional side view of the wafer of FIG. 3 after edge bead removal illustrating reduction in the thickness of the edge bead and removal of material on the wafer edge and bottom side in accordance with the invention. The essential features of FIG. 4 are the wafer 1, the stress buffer coating 3 wherein 3d represents the stress buffer coating edge bead of substantially reduced thickness compared to 3a, 1b represents the wafer edge, and 1c represents the clean wafer bottom side.

The EBR solvent composition of the present invention is be formulated and processed in a manner that solves the four engineering problems of 1) reducing the thickness of the stress buffer coating edge bead; 2) having drying characteristics such that residues are not deposited onto the bottom of the wafer; 3) removing dried coating material from the bottom side of the wafer; and 4) no tendency to promote the accumulation of coating process waste in the coating cup.

Use of one or more strong, polar-aprotic solvents that are good solvents for stress buffer coating compositions addresses the need for good solvency. Suitable strong, polar-aprotic solvents for use in the present invention include, for example, gamma-butyrolactone, gamma-valerolactone, gamma-caprolactone, delta-valerolactone, or any combinations thereof. Preferably, the one or more strong, polar-aprotic solvents is gamma-butyrolactone. The high boiling point (204-205° C.) and low vapor pressure (1.5 mm Hg) of gamma-butyrolactone retards drying in the coating cup and decreases the accumulation of coating waste in the coating cup. However, pure strong, polar-aprotic solvents, like gamma-butyrolactone, may dry very slowly during the EBR process resulting in contamination of the bottom side of the wafer from material moving over the edge of wafer onto the bottom side of the wafer.

The issue of slow drying is solved by adding lower boiling point solvents to the one or more strong, polar-aprotic solvents of the present invention to yield a solvent mixture with improved drying properties. However, the solvent mixture cannot contain an excessive amount of volatile solvent because the solvency of the mixture for the coating composition may be decreased to a point where the edge bead thickness is not sufficiently reduced and the rapid evaporation of solvent leads to an unacceptable amount of residue in the coating cup. Formation of coating cup residue can be reduced by using a solvent of intermediate volatility which slows drying in the coating cup. In the context of this invention, this solvent of intermediate volatility is termed a "buffer solvent". The drying speed of the EBR composition can be adjusted as desired by varying the amount of buffer solvent used in the composition.

Therefore, it is preferred that the EBR composition consist of mixtures of solvents selected from each of three boiling point ranges, namely low, intermediate and high. The preferred boiling point ranges are about 80° C. to about 160° C. (low), about 135° C. to about 185° C. (intermediate), and about 190° C. to about 235° C. (high). The solvents with boiling points in the range of about 80° C. to about 160° C. are useful for promoting drying of the EBR composition and may also be selected to improve solvency toward the stress buffer coating material. The buffer solvents in the boiling point range of about 135° C. to about 185° C. are particularly useful for adjusting the drying characteristics of the composition. The solvents in the boiling point range of about 190° C. to about 235° C. are useful for reducing the thickness of the edge bead and provide a further means of adjusting the drying characteristics of the EBR solvent composition.

The solvents with boiling points in the range of about 80° C. to about 160° C. are selected from the group of ketones containing 4 to 6 carbon atoms according to Formula 1 and Formula 2, set forth below.

Formula 1

Formula 2

In Formula 1, $R_1$ and $R_2$ are independently selected from the group of alkyl radicals consisting of methyl, ethyl, n-propyl, n-butyl, sec-butyl, and isobutyl. In Formula 2, n has the integer values of 1 and 2. These solvents may be used singly or in mixtures wherein the mixture has at least two ketones in the amount of about 0.5 wt. % to about 99.5 wt. % of the mixture of ketones. The preferred solvents are ketones selected from the group consisting of 2-pentanone, 3-pentanone, 2-hexanone and 3-hexanone, and mixtures of these solvents wherein the mixture consists of at least two solvents in the amount of about 0.5 wt. % to about 99.5 wt. % of the mixture. The most preferred solvents are 2-pentanone and 3-hexanone.

The buffer solvents in the boiling point range of about 135° C. to about 185° C. are one or more esters. Suitable esters for use in the invention include, for example, ethyl lactate, propylene glycol monomethyl ether acetate, isobutyl isobutyrate, ethylene glycol ethyl ether acetate, methyl acetoacetate, ethyl acetoacetate, and ethyl 3-ethoxypropionate. The esters may be used singly or as a mixture, where the mixture contains at least two esters each in the amount of about 0.5 wt. % to about 99.5 wt. % of the mixture. The most preferred ester is ethyl lactate.

The solvents in the boiling point range of about 190° C. to about 235° C. are useful for reducing the thickness of the edge bead and provide a further means of adjusting the drying characteristics of the EBR solvent composition. Lactones, for example, are suitable solvents and may be selected from the group consisting of gamma-butyrolactone, gamma-valerolactone, gamma-caprolactone, and delta-valerolactone. The lactones may be used singly or as mixtures containing at least two lactones each in the amount of about 0.5 wt. % to about 99.5 wt. % of the lactone mixture. The most preferred lactone is gamma-butyrolactone.

The novel photosensitive stress buffer coating edge bead remover compositions according to the present invention include about 25 wt. % to about 55 wt. % of a ketone or mixture of two or more ketones according to Formula 1 and Formula 2, wherein the ketone according to Formula 1 contains about 4 to 6 carbon atoms and $R_1$ and $R_2$ are independently selected from the group of alkyl radicals consisting of methyl, ethyl, n-propyl, n-butyl, sec-butyl, and isobutyl, and wherein the ketone according to Formula 2 is selected from the group where n equals about 1 or 2; about 20 wt. % to about 55 wt. % of an ester or mixture of esters other than lactones; and about 10 wt. % to about 35 wt. % of a lactone or a mixture of lactones. The more preferred compositions include about 30 wt. % to about 50 wt. % 2-pentanone; about 30 wt. % to about 50 wt. % ethyl lactate; and about 15 wt. % to about 35 wt. % gamma-butyrolactone. The most preferred compositions include about 35 wt. % to about 50 wt. % 2-pentanone; about 35 wt. % to about 50 wt. % ethyl lactate; and about 20 wt. % to about 30 wt. % gamma-butyrolactone.

The following examples illustrate the present invention and are in no way intended to limit the scope of the invention.

EXAMPLES

General Formulation Procedure For EBR Solvent Compositions

Appropriate amounts by weight of each microelectronic grade solvent were combined in a 4 liter plastic bottle. The bottle was sealed and the solvents were mixed by rolling on ajar mill for two hours. The resulting solutions were tested as an EBR solvent composition. The solvents used in formulating the Examples and Comparative Examples of the invention are designated as shown below in Table 1.

TABLE 1

Solvents used in formulation edge bead removal solvent compositions.

| Solvent | Solvent Name | CAS Number | Boiling Point ° C. |
|---|---|---|---|
| Solvent A | Ethyl lactate | 97-64-3 | 154 |
| Solvent B | gamma-Butyrolactone | 96-48-0 | 204-205 |
| Solvent C | 2-Pentanone | 107-87-9 | 100-101 |
| Solvent D | Butyl lactate | 138-22-7 | 185-187 |
| Solvent E | gamma-Valerolactone | 108-29-2 | 207-208 |
| Solvent F | 2-Hexanone | 591-78-6 | 127 |
| Solvent G | Pinacolone | 75-97-8 | 106 |

Results of the EBR Solvent Drying Test

Rapid and complete bottom side drying is an important performance characteristic of EBR solvent compositions for use with stress buffer coatings according to the invention. The drying behavior of EBR compositions was characterized using an EBR solvent drying test. In this test, a series of 100 mm diameter silicon wafers were spun on the chuck of an SVG 8600 spin coating tool equipped with stationary top and bottom side spray dispensing nozzles at a rotational speed of 1200 rpm for a period of 3-5 seconds while an edge bead removal solvent composition was simultaneously applied to the bottom side of the wafer. The procedure was repeated using constant EBR solvent application parameters and varying the spin time and spin speed used to dry the wafer. The variable combinations of drying time and speed parameters used were 1500 rpm for 15 seconds, 2000 rpm for 20 seconds, and 2500 rpm for 25 seconds. The wafers were inspected after spin drying for the presence of residual solvent on the backside of the wafer.

The test results are reported in Table 2 as the spin drying parameters where complete drying was achieved. The preferred result was to obtain complete bottom side drying after 25 seconds at 2500 rpm. The most preferred result was to obtain complete bottom side drying after 20 seconds at 2000 rpm as these conditions represent a more economical process with respect to the process time of the drying cycle. The drying test data from the compositions of Comparative Examples 1-6 shown in Table 2 show that mixtures of ethyl lactate (boiling point 154° C.) and gamma butyrolactone (boiling point 204-205° C.) dry under the preferred condition when the mixtures contain 30% or less gamma-butyrolactone. This is contrary to the teaching of JP 2000-319691 wherein compositions containing 60-100% of gamma-butyrolactone and 10-40% of a solvent with a boiling point lower than gamma-butyrolactone are claimed to dry easily when used as EBR solvents for stress buffer coatings. The drying data from the composition of Comparative Example 7 shows that the amount of ethyl lactate can be reduced to 45% if 35% of the more volatile solvent pinacolone (boiling point 106° C.) is added to the composition. Similarly, the drying results from the compositions of Examples 1-6 show that the inclusion of 25-45% of either 2-pentanone (boiling point 100-101° C.) or 2-hexanone (boiling point 127° C.) in the formulation allows reduction in the amount of ethyl lactate buffer solvent needed to dry compositions containing up to 30% gamma-butyrolactone using the preferred drying cycle of 25 seconds at 2500 rpm. Adjusting the amount of either ketone to 35-45% leads to complete drying using the most preferred drying cycle of 20 seconds at 2000 rpm. Data from the composition of Example 4 shows that gamma-valerolactone can be substituted for gamma-butyrolactone and Example 6 shows that a mixture of lactones can be used. Thus, the ternary formulations according to the invention provide a means of achieving the required EBR solvent drying characteristics while maintaining a significant amount of a lactone or lactone mixture in the composition.

Results of the EBR Solvent Stripping Test

Removing stress buffer coating contamination deposited on the bottom side of the wafer during spin coating is an important function of the EBR solvent composition. The process for removing bottom side contamination is frequently referred to in the art as "backside cleaning" and it is to be understood that such a process is part of this invention. Bottom side contamination often occurs as isolated deposits of coating material that has been substantially dried by convection during the spin coating process. Removal of these isolated deposits of substantially dried material requires a stronger solvent than the solvent needed for removal of wet coating material. Accordingly, the EBR solvent compositions of the invention were tested for their effectiveness in removing dried coating material.

In this test, a series of 100 mm diameter silicon wafers were spin coated with stress buffer coating composition using an SVG Model 8600 coater tool equipped with top and bottom edge bead solvent dispense nozzles. The stress buffer coating material composition was Durimide™ 9005, a positive-tone photosensitive formulation commercially available from Arch Chemicals, Inc. The spin coating conditions were to dispense and spread 1 mL of composition at 1200 rpm for 4 seconds followed by spinning at 2500 rpm for 15 seconds. The wafers were then softbaked at 115° C. for 3 minutes on a hotplate. The thickness of the resulting coating was measured using a KLA-Tencor P-11 profilometer. The EBR solvent to be tested was then applied to the center of the wafer using the topside EBR dispense nozzle using a 60 second dispense time and a solvent flow rate of 67.5 g/minute at 1000 rpm followed by a spin dry cycle at 2000 rpm for 20 seconds. The thickness measurement was then repeated and the coating thickness difference between the soft baked coating without EBR processing and the thickness of the coating with EBR processing was calculated. The calculated thickness difference was used as a measure of the effectiveness of a composition in removing the soft baked coating.

Table 2 shows the results of these experiments for the Examples and Comparative Examples, respectively, of this invention. Comparative Examples 1-3, while meeting the preferred drying characteristics, have poor solvency for dried material as only a modest amount of film is removed. Increasing the amount of lactone as in the compositions of Comparative Examples 4-6 does not improve the result. We believe this behavior is due to film swelling at the higher concentrations of lactone solvent. In contrast, the compositions of Examples 1-6 all show good solvency toward dried material and meet the preferred drying requirement. Examples 1-3 demonstrate complete removal of the dried film and provide the most preferred drying characteristics. Examples 1-6 also show that solvency is greatly improved by including either 2-pentanone (boiling point 101° C.) or 2-hexanone (boiling point 127° C.) in the composition. Use of either of these ketones in the compositions allows inclusion of up to 30% of the high boiling lactone solvents in the composition.

front side edge bead can be minimized but not completely removed during edge bead solvent application. The goal is to minimize the negative impact of the edge bead on wafer processing and yield by reducing the thickness of the edge bead region of the film to a thickness as nearly equal to the thickness of the rest of the film as possible. To test for this requirement, a series of 100 mm diameter silicon wafer was spin coated with Durimide™ 9005 using a SVG 8600 spin coating tool equipped with stationary top and bottom side solvent dispense nozzles. As is usually done in the art, a coating tool operating program was used that combines the processes of spin coating and edge bead removal into one continuous machine process. The program used was:

(1) 4 seconds at 1200 rpm, apply stress buffer coating composition;
(2) 15 seconds at 2500 rpm, spin coat stress buffer coating composition;
(3) 1.5 seconds at 750 rpm, apply EBR solvent to top side of wafer;
(4) 3 seconds at 1200 rpm, apply EBR solvent to bottom side of wafer; and
(5) 20 seconds at 2000 rpm, spin dry wafer.

The wafers were then softbaked on a hotplate for 3 minutes at 115° C. and optically inspected for the presence or absence of edge bottom side residues. The degree of top side edge bead removal was evaluated using a KLA-Tencor

TABLE 2

Solvent drying and solvent stripping test results for Examples 1 through 6 and Comparative Examples 1-8 of the invention.

| Example | % A | % B | % C | % D | % E | % F | % G | Solvent Drying Test Result | Solvent Stripping Test Results Film Thickness Removed (microns) |
|---|---|---|---|---|---|---|---|---|---|
| Example 1 | 45 | 20 | 35 | 0 | 0 | 0 | 0 | 20 s @ 2000 rpm | 11.3 |
| Example 2 | 45 | 30 | 25 | 0 | 0 | 0 | 0 | 25 s @ 2500 rpm | 11.3 |
| Example 3 | 35 | 20 | 45 | 0 | 0 | 0 | 0 | 20 s @ 2000 rpm | 15 |
| Example 4 | 45 | 0 | 35 | 0 | 20 | 0 | 0 | 20 s @ 2000 rpm | 9.2 |
| Example 5 | 45 | 20 | 0 | 0 | 0 | 35 | 0 | 20 s @ 2000 rpm | 7.0 |
| Example 6 | 45 | 9 | 35 | 0 | 11 | 0 | 0 | 25 s @ 2500 rpm | 8.6 |
| Comparative Example 1 | 100 | 0 | 0 | 0 | 0 | 0 | 0 | 20 s @ 2000 rpm | 0.9 |
| Comparative Example 2 | 90 | 10 | 0 | 0 | 0 | 0 | 0 | 20 s @ 2000 rpm | 1.2 |
| Comparative Example 3 | 80 | 20 | 0 | 0 | 0 | 0 | 0 | 20 s @ 2000 rpm | 2.7 |
| Comparative Example 4 | 75 | 25 | 0 | 0 | 0 | 0 | 0 | 25 s @ 2500 rpm | 1.8 |
| Comparative Example 5 | 70 | 30 | 0 | 0 | 0 | 0 | 0 | 25 s @ 2500 rpm | 3.7 |
| Comparative Example 6 | 60 | 40 | 0 | 0 | 0 | 0 | 0 | 25 s @ 2500 rpm | 2.9 |
| Comparative Example 7 | 45 | 20 | 0 | 0 | 0 | 0 | 35 | 25 s @ 2500 rpm | 1.2 |
| Comparative Example 8 | 0 | 20 | 35 | 45 | 0 | 0 | 0 | 25 s @ 2500 rpm | 5.0 |

Description of the Top and Bottom Side Application Test

Stress buffer coatings present unique problems for edge bead removal processing. With photoresists, the front edge bead can be removed leaving a clear clean outer edge about 1-3 mm wide. With photosensitive stress buffer coatings, the P11 profilometer. The profilometer stylus was set on the film at a point approximately 6 mm from the edge of the wafer. The stylus was then scanned toward the wafer edge to a point off the edge of the wafer. The height of the edge bead above the surface plane of the film was determined from the profilometer scan data. The quality of the edge bead removal with respect to bottom side and edge cleanliness was determined by optical inspection and rated as passing if the bottom side was clean and as not passing if coating material was still observed on the bottom side of the wafer.

TABLE 3

Top and bottom side application test results for Examples 7 and 8 and Comparative Examples 9-12 of the invention.

| | % A | % B | % C | Inspection Results | Edge Bead Height in microns |
|---|---|---|---|---|---|
| Example 7 | 45 | 20 | 35 | P | 3.0 |
| Example 8 | 35 | 20 | 45 | P | 7.8 |
| Comparative Example 9 | 80 | 20 | 0 | F | −1.0 |
| Comparative Example 10 | 70 | 30 | 0 | F | −4.0 |
| Comparative Example 11 | 55 | 0 | 45 | P | 16.0 |
| Comparative Example 12 (No EBR) | 0 | 0 | 0 | F | 13.0 |

The data from Examples 7 and 8 in Table 3 shows reduction in the edge bead thickness relative to the 13 microns thick edge bead that is formed when no EBR process is used (Comparative Example 12). In the experiments of Example 7 and 8, the wafer bottom side was free of coating contamination while the wafers of Comparative Examples 9 and 10, while having edge beads of reduced thickness, had bottom side contamination due to the slow drying characteristics and poor solvency of the comparative compositions. In contrast to Example 3, the results of Comparative Example 11 shows that a composition containing only 2-pentanone and ethyl lactate, while removing backside contamination, is not effective in reducing the thickness of the edge bead and actually cause an increase in edge bead thickness. Thus, it is necessary to include a lactone or lactone mixture in the formulation in order to reduce the thickness of the edge bead.

Example 13

EBR Processing of a Positive Photoresist

The utility of a most preferred EBR solvent compositions for removing the edge bead and bottom side contamination of photoresist coatings was also evaluated. Accordingly, a 100 mm diameter silicon wafer was spin coated with OiR™ 620, a positive photoresist composition commercially available from Arch Chemicals, Inc. The coating was applied using an SVG 8600 spin coater using a rotational speed of 3000 rpm and a spinning time of 30 seconds. The top side edge bead was then contacted with the EBR solvent formulation of Example 3. The EBR process consisted of a top side dispense of EBR solvent for 6 seconds at 1000 rpm followed by a bottom side EBR dispense cycle using a dispense time of 8 seconds at 3000 rpm. The EBR process was completed with a spin drying cycle of 7 seconds at 3000 rpm. The wafer was then baked on a hotplate at 90° C. for 30 seconds to yield a firm film 1.0 micron in thickness. The baked wafer was free of edge and bottom side contamination and the coating edge bead was removed to yield a clean substrate according to FIG. 2. Therefore, the EBR compositions of this invention may be used to process photoresist films.

It should be understood that the foregoing description is only illustrative of the present invention. Various alternatives and modifications can be devised by those skilled in the art without departing from the invention. Accordingly, the present invention is intended to embrace all such alternatives, modifications and variances.

What is claimed is:

1. An edge bead remover composition comprising:
at least one ketone selected from the group consisting of:

Formula 1

Formula 2 wherein $R_1$ and $R_2$ are independently selected from the group consisting of:
methyl, ethyl, n-propyl, and combinations thereof, wherein n equals 1 or 2, and wherein said ketone of said Formula 1 has a total of 4 to 5 carbon atoms;
at least one ester other than lactones; and
at least one lactone;
wherein said at least one ketone is 2-pentanone, present in an amount between 35 wt. % to 50 wt. %; said at least one ester is ethyl lactate, present in an amount between 35 wt. % to 50 wt. %; and said at least one lactone is gamma-butyrolactone, present in an amount between 20 wt. % to 30 wt. %.

* * * * *